US011768427B2

(12) United States Patent
Nagatani et al.

(10) Patent No.: US 11,768,427 B2
(45) Date of Patent: Sep. 26, 2023

(54) PROJECTOR

(71) Applicant: SEIKO EPSON CORPORATION, Tokyo (JP)

(72) Inventors: Kaname Nagatani, Matsumoto (JP); Osamu Katsuda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 455 days.

(21) Appl. No.: 17/161,835

(22) Filed: Jan. 29, 2021

(65) Prior Publication Data

US 2021/0232030 A1     Jul. 29, 2021

(30) Foreign Application Priority Data

Jan. 29, 2020   (JP) ................................. 2020-012783

(51) Int. Cl.
    *G03B 21/16*          (2006.01)
    *H05K 7/20*            (2006.01)

(52) U.S. Cl.
    CPC ......... *G03B 21/16* (2013.01); *H05K 7/20136* (2013.01); *H05K 7/20309* (2013.01); *H05K 7/20318* (2013.01); *H05K 7/20354* (2013.01)

(58) Field of Classification Search
    CPC .... G03B 21/16; G03B 21/145; H04N 9/3144; H05K 7/20354; H05K 7/20318; H05K 7/20309; H05K 7/20136

See application file for complete search history.

(56) References Cited

U.S. PATENT DOCUMENTS

| | | | |
|---|---|---|---|
| 9,261,761 B2 | 2/2016 | Kuriaki | |
| 2006/0285331 A1* | 12/2006 | Wang | F21S 9/037 348/E5.142 |
| 2008/0030688 A1* | 2/2008 | Lee | G03B 21/16 353/54 |
| 2008/0236190 A1* | 10/2008 | Tsuchiya | G03B 21/16 62/468 |
| 2008/0236191 A1* | 10/2008 | Tsuchiya | G03B 21/16 62/513 |

(Continued)

FOREIGN PATENT DOCUMENTS

| | | |
|---|---|---|
| CN | 112415839 A | 2/2021 |
| JP | 2009-122385 A | 6/2009 |

(Continued)

*Primary Examiner* — Bao-Luan Q Le
(74) *Attorney, Agent, or Firm* — Dority & Manning, P.A.

(57) ABSTRACT

A projector includes first and second cooling targets and a cooling device. The cooling device includes a first compressor, a condenser, a first expander configured to decompress a part of the working fluid condensed by the condenser, a first evaporator configured to change the working fluid in a liquid phase flowing from the first expander into the working fluid in a gas phase by using heat from the first cooling target, a second expander configured to decompress the other part of the working fluid condensed by the condenser, a second evaporator configured to change the working fluid in a liquid phase flowing from the second expander into the working fluid in a gas phase by using heat from the second cooling target, and a second compressor configured to compress the working fluid in a gas phase flowing from the second evaporator.

9 Claims, 6 Drawing Sheets

(56) References Cited

U.S. PATENT DOCUMENTS

| | | | | |
|---|---|---|---|---|
| 2009/0266098 A1* | 10/2009 | Nishijima | ............. | G03B 21/16 62/513 |
| 2010/0045940 A1* | 2/2010 | Takagi | ................... | G03B 21/16 353/54 |
| 2010/0066980 A1* | 3/2010 | Tsuchiya | ............. | H04N 9/3105 353/57 |
| 2010/0118279 A1* | 5/2010 | Itsuki | ................... | H04N 9/3144 353/54 |
| 2010/0253923 A1* | 10/2010 | Yanagisawa | ............. | F28F 3/12 353/54 |
| 2010/0302463 A1* | 12/2010 | Matsumoto | ........... | G03B 21/16 348/744 |
| 2010/0315600 A1* | 12/2010 | Nishimura | ............. | F21V 29/67 353/57 |
| 2011/0019160 A1* | 1/2011 | Kitano | ................... | G03B 21/16 353/57 |
| 2011/0032489 A1* | 2/2011 | Kimoto | ................ | H04N 9/3144 353/56 |
| 2011/0037954 A1* | 2/2011 | Tsuchiya | .............. | H04N 9/3164 353/54 |
| 2011/0211166 A1* | 9/2011 | Kawano | .............. | H04N 9/3144 353/20 |
| 2013/0192294 A1* | 8/2013 | Yoo | ....................... | F25B 49/022 417/2 |
| 2015/0198869 A1* | 7/2015 | Kuriaki | ................ | G03B 21/005 353/54 |
| 2016/0147034 A1 | 5/2016 | Shoujiguchi et al. | | |
| 2020/0296859 A1* | 9/2020 | Takagi | ............... | H05K 7/20318 |

FOREIGN PATENT DOCUMENTS

| | | |
|---|---|---|
| JP | 2015-132659 A | 7/2015 |
| WO | WO2015/008485 A | 1/2015 |

* cited by examiner

PROJECTOR

The present application is based on, and claims priority from JP Application Serial Number 2020-012783, filed Jan. 29, 2020, the disclosure of which is hereby incorporated by reference herein in its entirety.

BACKGROUND

1. Technical Field

The present disclosure relates to a projector.

2. Related Art

JP-A-2015-132659 discloses a projector including an indoor unit that is provided indoors and projects an image and an outdoor unit that is provided outdoors.

In the projector disclosed in JP-A-2015-132659, the indoor unit includes R, G, B laser heat sinks, a first refrigerant pipe, a drain pipe, and an electronic expansion valve, in addition to R, G, B laser clusters, an optical combining unit, and a projection lens. The outdoor unit includes a second refrigerant pipe, a cooling device, and a refrigerant heater. A communication line and a refrigerant pipe that couples one end of the first refrigerant pipe and one end of the second refrigerant pipe and couples the other end of the first refrigerant pipe and the other end of the second refrigerant pipe are arranged between the indoor unit and the outdoor unit.

In the projector, the electronic expansion valve, the G laser heat sink, the B laser heat sink, and the R laser heat sink are coupled in series in this order via the first refrigerant pipe.

The second refrigerant pipe forms a loop refrigerant path together with the first refrigerant pipe via the refrigerant pipe. The refrigerant flows in one end of the electronic expansion valve, the laser heat sinks, the refrigerant heater, a refrigerant compressor and a condenser of the cooling device, and the other end of the electronic expansion valve in this order.

The refrigerant compressor compresses a refrigerant gas to increase a temperature and a pressure of the refrigerant gas to a high temperature and a high pressure. The condenser exchanges heat between the refrigerant gas at a high temperature and a high pressure and outside air that is blown into the outdoor unit from outside by a fan, thereby converting the refrigerant gas into a high-pressure liquid refrigerant.

The electronic expansion valve decompresses the high-pressure liquid refrigerant into a liquid refrigerant that is easy to be vaporized. The electronic expansion valve controls a decompressing amount of a refrigerant in the first refrigerant pipe to control an evaporation temperature of the refrigerant, and cools the laser heat sinks by a latent heat effect of the refrigerant.

When the refrigerant flows into the refrigerant compressor in a state of being not completely vaporized, the refrigerant compressor is adversely affected. Thus, the refrigerant flowing into the refrigerant compressor is heated by the refrigerant heater.

According to the configuration as described above, in portions of the refrigerant path from the one end of the electronic expansion valve to the laser heat sinks and the refrigerant heater, the laser heat sinks and the like are maintained at a constant temperature by the latent heat effect of the refrigerant. In this manner, the cooling device can cool the laser heat sinks and the R, G, B laser clusters to certain constant temperatures by the refrigerant circulating in the refrigerant path.

However, since the projector disclosed in JP-A-2015-132659 includes the outdoor unit coupled to the indoor unit via the refrigerant pipe and the communication line, there is a problem that installation of the projector is complicated.

SUMMARY

A projector an aspect of the present disclosure modulates and projects light emitted from a light source. The projector includes a first cooling target, a second cooling target, a cooling device configured to cool the first cooling target and the second cooling target, and an exterior housing accommodating the first cooling target, the second cooling target, and the cooling device. The cooling device includes: a first pipe, a second pipe, a third pipe, a fourth pipe, a fifth pipe, a sixth pipe, a first compressor configured to compress a working fluid in a gas phase, a condenser coupled with the first compressor via the first pipe, and configured to condense the working fluid in a gas phase compressed by the first compressor into a working fluid in a liquid phase, a first expander coupled with the condenser via the second pipe, and configured to decompress a part of the working fluid condensed by the condenser to change the working fluid into a working fluid in a mixed phase of a liquid phase and a gas phase, a first evaporator coupled with the first expander via the third pipe, configured to change the working fluid in a liquid phase flowing from the first expander into the working fluid in a gas phase by using heat transferred from the first cooling target, and configured to discharge the working fluid changed into a gas phase to the first compressor coupled with the first evaporator via the fourth pipe, a second expander coupled with the condenser via the second pipe, and configured to decompress the other part of the working fluid condensed by the condenser to change the working fluid into the working fluid in a mixed phase of a liquid phase and a gas phase, a second evaporator coupled with the second expander via the fifth pipe, and configured to change, into the working fluid in a gas phase, the working fluid in a liquid phase flowing from the second expander by using heat transferred from the second cooling target, and a second compressor coupled with the first compressor via the fourth pipe and coupled with the second evaporator via the sixth pipe, the second compressor being configured to compress the working fluid in a gas phase flowing from the second evaporator, and discharge the working fluid to the first compressor via the fourth pipe.

DESCRIPTION OF EXEMPLARY EMBODIMENTS

First Embodiment

Hereinafter, a first embodiment of the present disclosure will be described with reference to drawings.

Schematic Configuration of Projector

Figure 1:
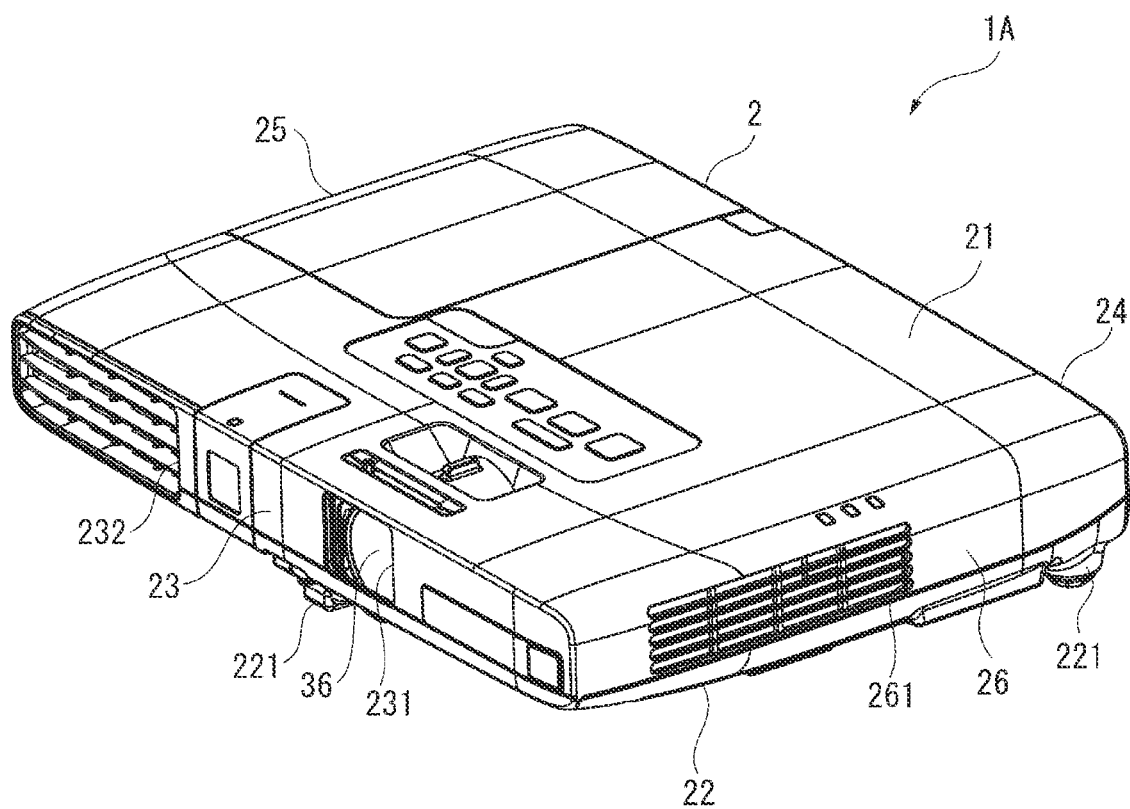
FIG. 1 is a perspective view showing an appearance of a projector according to a first embodiment.

FIG. 1 is a perspective view showing an appearance of a projector 1A according to the present embodiment.

The projector 1A according to the present embodiment is an image display device that modulates light emitted from a light source to form an image according to image information, and enlarges and projects the formed image on a projection surface such as a screen. As shown in FIG. 1, the projector 1A includes an exterior housing 2 constituting an exterior of the projector 1A.

Configuration of Exterior Housing

The exterior housing 2 has a top surface portion 21, a bottom surface portion 22, a front surface portion 23, a rear surface portion 24, a left side surface portion 25, and a right side surface portion 26. The exterior housing 2 is formed into a substantially rectangular parallelepiped shape.

The bottom surface portion 22 has a plurality of leg portions 221 in contact with an installation surface on which the projector 1A is mounted.

The front surface portion 23 is positioned at an image projection side of the exterior housing 2. The front surface portion 23 has an opening 231 from which a part of a projection optical device 36 to be described later is exposed, and an image projected by the projection optical device 36 passes through the opening 231. The front surface portion 23 has an exhaust port 232 through which a cooling gas that cools a cooling target in the projector 1A is discharged to an outside of the exterior housing 2.

The right side surface portion 26 has an introduction port 261 through which a gas such as air outside the exterior housing 2 is introduced into the exterior housing 2 as a cooling gas.

Internal Configuration of Projector

Figure 2:
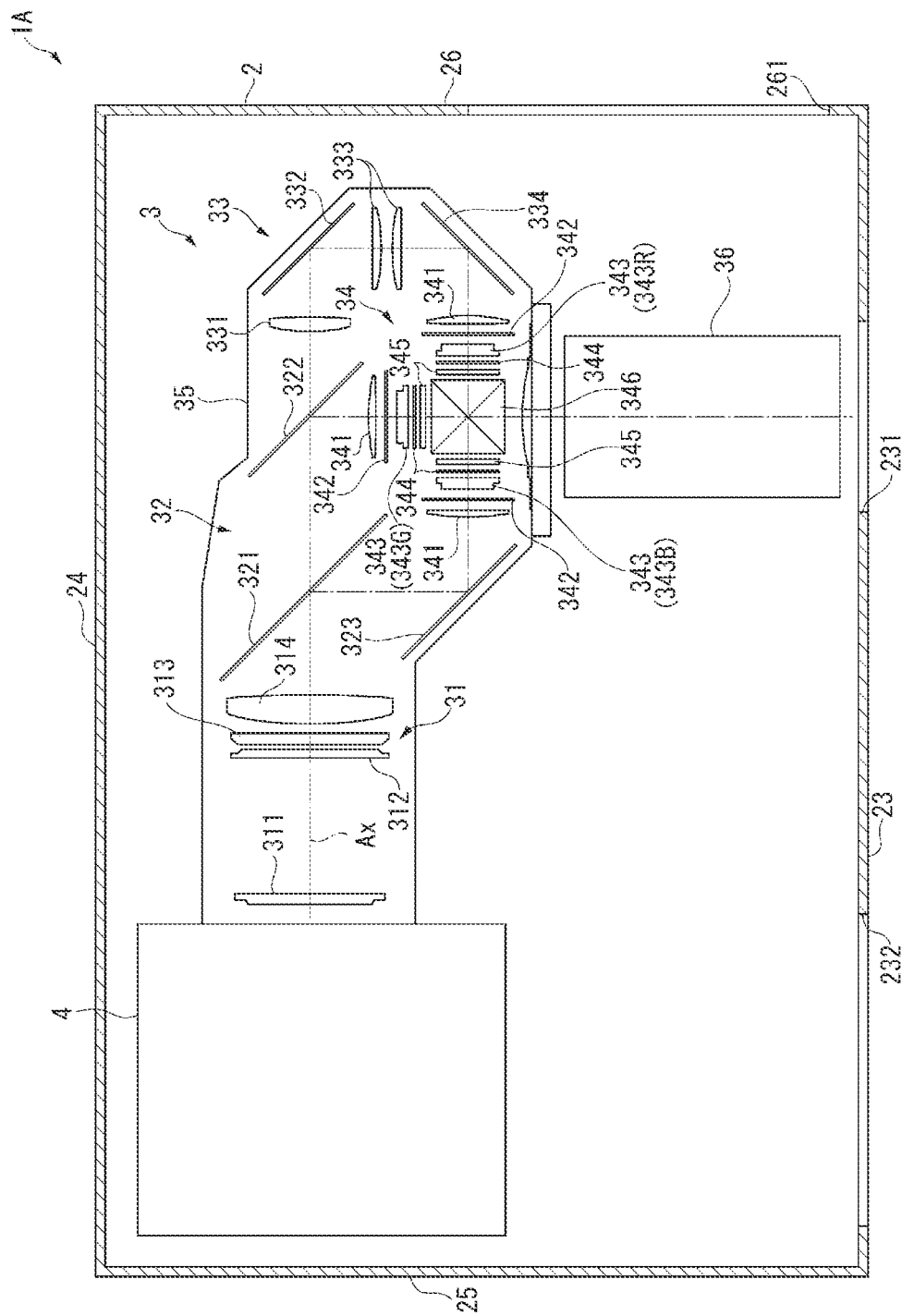
FIG. 2 is a schematic diagram showing an internal configuration of the projector according to the first embodiment.

FIG. 2 is a schematic diagram showing an internal configuration of the projector 1A.

As shown in FIG. 2, the projector 1A further includes an image projection device 3 that is accommodated in the exterior housing 2. Although not shown in FIG. 2, the projector 1A includes a cooling target, a cooling device 5A (see FIG. 4) that cools the cooling target, a control device that controls an operation of the projector 1A, and a power supply device that supplies power to electronic components of the projector 1A.

Configuration of Image Projection Device

The image projection device 3 forms an image according to image information received from the control device, and projects the formed image. The image projection device 3 includes a light source device 4, a homogenizing unit 31, a color separation unit 32, a relay unit 33, an image forming unit 34, an optical component housing 35, and the projection optical device 36.

The light source device 4 emits illumination light. A configuration of the light source device 4 will be described later in detail.

The homogenizing unit 31 homogenizes the illumination light emitted from the light source device 4. The homogenized illumination light passes through the color separation unit 32 and the relay unit 33 and illuminates a modulation area of a to-be-described light modulator 343 of the image forming unit 34. The homogenizing unit 31 includes two lens arrays 311 and 312, a polarization conversion element 313, and a superimposition lens 314.

The color separation unit 32 separates light incident from the homogenizing unit 31 into a red light beam, a green light beam, and a blue light beam. The color separation unit 32 includes two dichroic mirrors 321 and 322, and a reflection mirror 323 that reflects the blue light beam separated by the dichroic mirror 321.

The relay unit 33 is provided on an optical path of the red light beam that has a longer optical path than other color light beams, and prevents a loss of the red light beam. The relay unit 33 includes an incident side lens 331, a relay lens 333, and reflection mirrors 332 and 334. In the present embodiment, the relay unit 33 is provided on the optical path of the red light beam. However, the present disclosure is not limited thereto, and may have a configuration in which, for example, a blue light beam has a longer optical path than other color light beams, and the relay unit 33 is provided on an optical path of the blue light beam.

The image forming unit 34 modulates an incident red light beam, green light beam, and blue light beam and combines the modulated color light beams to form an image. The image forming unit 34 includes, corresponding to the incident color light beams, three field lenses 341, three incident side polarizers 342, three light modulators 343, three viewing angle compensation plates 344, three emission side polarizers 345, and one color combining unit 346.

The light modulator 343 modulates light emitted from the light source device 4 according to the image information. The light modulator 343 includes a red light modulator 343R, a green light modulator 343G, and a blue light modulator 343B. In the present embodiment, the light modulator 343 is implemented by a transmissive liquid crystal panel, and a liquid crystal light valve includes the incident side polarizer 342, the light modulator 343, and the emission side polarizer 345.

The color combining unit 346 combines color light beams modulated by the light modulators 343B, 343G, and 343R to form an image. Although the color combining unit 346 is implemented by a cross dichroic prism in the present embodiment, the present disclosure is not limited thereto. For example, the color combining unit 346 may be implemented by a plurality of dichroic mirrors.

The optical component housing 35 accommodates the above-described units 31 to 34 therein. An illumination optical axis Ax which is an optical axis in design is set in the image projection device 3. The optical component housing 35 accommodates the units 31 to 34 at predetermined positions on the illumination optical axis Ax. The light source device 4 and the projection optical device 36 are provided at predetermined positions on the illumination optical axis Ax.

As will be described in detail later, the projector 1A includes a sealed housing SC (see FIG. 4) of which a part is formed by the optical component housing 35. The sealed housing SC accommodates the incident side polarizers 342, the light modulators 343, the viewing angle compensation plates 344, the emission side polarizers 345, and the color combining unit 346 that constitute the image forming unit 34. The incident side polarizers 342, the light modulators 343, the viewing angle compensation plates 344, the emission side polarizers 345, and the color combining unit 346 are cooled by a cooling gas circulating in the sealed housing SC. The cooling gas in the sealed housing SC is cooled by a second evaporator 56 (see FIG. 4) provided in the sealed housing SC among constituent elements of the cooling device 5A.

The projection optical device 36 is a projection lens that enlarges and projects an image incident from the image forming unit 34 onto a projection surface. That is, the projection optical device 36 projects light beams modulated by the light modulators 343B, 343G, and 343R. The projection optical device 36 is implemented as, for example, an assembled lens in which a plurality of lenses are accommodated in a cylindrical lens barrel.

Configuration of Light Source Device

Figure 3:
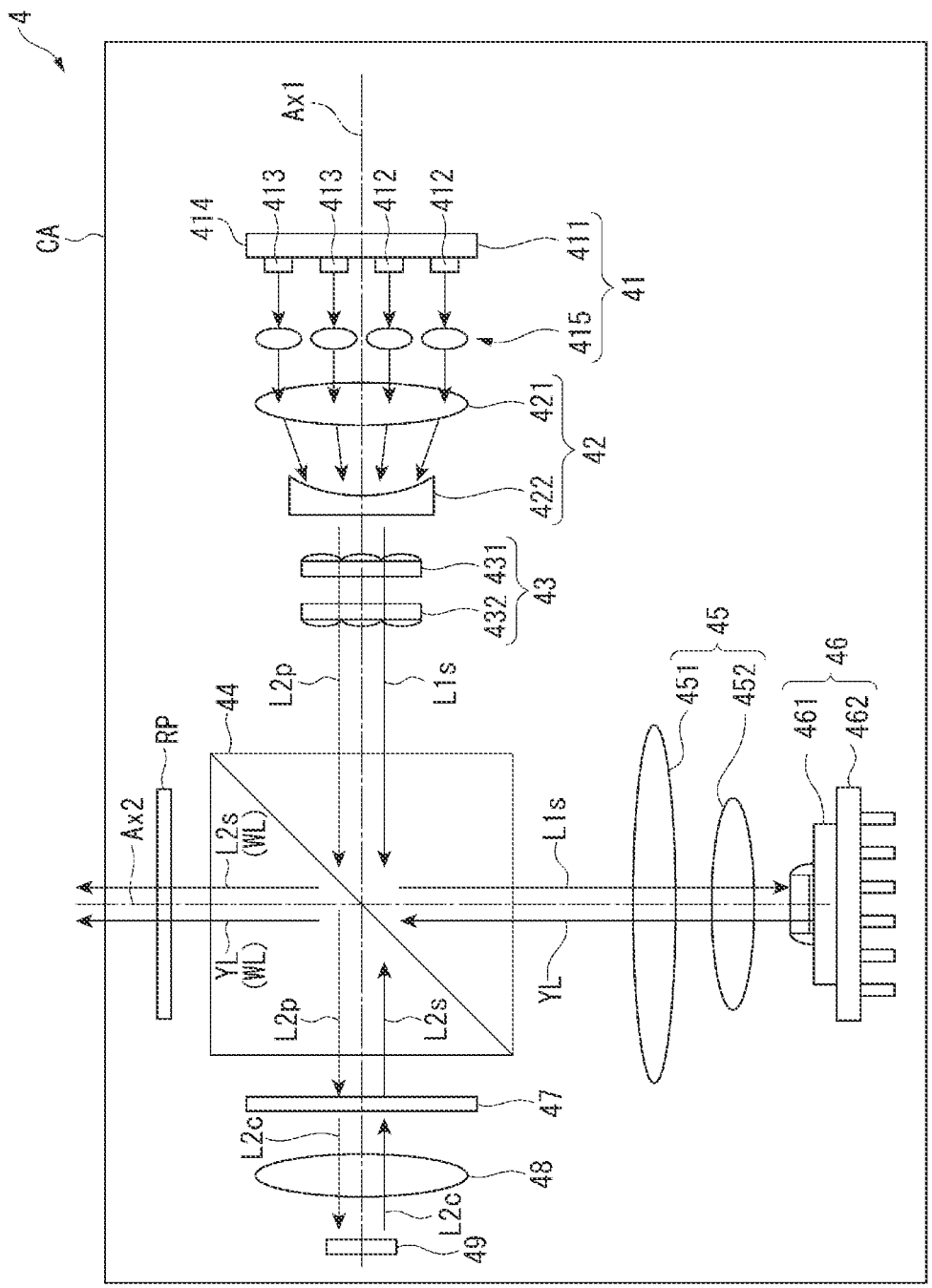
FIG. 3 is a schematic diagram showing a configuration of a light source device according to the first embodiment.

FIG. 3 is a schematic diagram showing a configuration of the light source device 4.

The light source device 4 emits illumination light to the homogenizing unit 31. As shown in FIG. 3, the light source device 4 includes a light source housing CA, a light source unit 41, an a focal optical element 42, a homogenizer optical element 43, a polarization separation element 44, a first light collecting element 45, a wavelength conversion element 46, a first phase difference element 47, a second light collecting element 48, a diffusion reflection unit 49, and a second phase difference element RP that are accommodated in the light source housing CA.

The light source housing CA is implemented as a sealed housing into which dust or the like is less likely to enter.

The light source unit 41, the a focal optical element 42, the homogenizer optical element 43, the polarization separation element 44, the first phase difference element 47, the second light collecting element 48, and the diffusion refection unit 49 are provided on an illumination optical axis Ax1 set in the light source device 4.

The wavelength conversion element 46, the first light collecting element 45, the polarization separation element 44, and the second phase difference element RP are provided on an illumination optical axis Ax2 that is set in the light source device 4 and orthogonal to the illumination optical axis Ax1. The illumination optical axis Ax2 coincides with the illumination optical axis Ax at a position of the lens array 311. In other words, the illumination optical axis Ax2 is set on an extension line of the illumination optical axis Ax.

Configuration of Light Source Unit

The light source unit 41 includes a light source 411 that emits light and a collimator lens 415.

The light source 411 includes a plurality of first semiconductor lasers 412, a plurality of second semiconductor lasers 413, and a support member 414.

The first semiconductor laser 412 emits an s-polarized blue light beam L1s that is excitation light. The blue light beam L1s is, for example, a laser beam having a peak wavelength of 440 nm. The blue light beam L1s emitted from the first semiconductor laser 412 is incident on the wavelength conversion element 46.

The second semiconductor laser 413 emits a p-polarized blue light beam L2p. The blue light beam L2p is, for example, a laser beam having a peak wavelength of 460 nm. The blue light beam L2p emitted from the second semiconductor laser 413 is incident on the diffusion reflection unit 49.

The support member 414 supports the plurality of first semiconductor lasers 412 and the plurality of second semiconductor lasers 413 arranged in an array on a plane orthogonal to the illumination optical axis Ax1. The support member 414 is a metal member having heat conductivity, and is coupled with a first evaporator 54 to be described later via a heat transfer member TM. Then, heat of the light source 411 including the semiconductor lasers 412 and 413 which are heat sources is transferred to the first evaporator 54 via the heat transfer member TM. As a result, the light source 411 is cooled.

The blue light beam L1s emitted from the first semiconductor laser 412 and the blue light beam L2p emitted from the second semiconductor laser 413 are converted into parallel light beams by the collimator lens 415, and are incident on the a focal optical element 42.

In the present embodiment, the light source 411 emits the s-polarized blue light beam L1s and the p-polarized blue light beam L2p. However, the present disclosure is not limited thereto, and the light source 411 may emit blue light beams that are linearly polarized light beams having the same polarization direction. In this case, a phase difference element that coverts one type of incident linearly polarized light beam into light containing an s-polarized light beam and a p-polarized light beam may be provided between the light source unit 41 and the polarization separation element 44.

Configuration of Afocal Optical Element and Homogenizer Optical Element

The afocal optical element 42 adjusts light beam diameters of the blue light beams L1s and L2p incident from the light source unit 41, and causes the blue light beams L1s and L2p to be incident on the homogenizer optical element 43. The afocal optical element 42 includes a lens 421 that collects incident light beams and a lens 422 that collimates the light beams collected by the lens 421.

The homogenizer optical element 43 homogenizes an illuminance distribution of the blue light beams L1s and L2p. The homogenizer optical element 43 includes a pair of multi-lens arrays 431 and 432.

Configuration of Polarization Separation Element

The blue light beams L1s and L2p that passed through the homogenizer optical element 43 are incident on the polarization separation element 44.

The polarization separation element 44 is a prism-type polarization beam splitter, and separates an s-polarized component and a p-polarized component contained in the incident light beams. Specifically, the polarization separation element 44 reflects the s-polarized component and transmits the p-polarized component. The polarization separation element 44 has a color separation characteristic that allows a light beam having a wavelength equal to or larger than a predetermined wavelength to pass through regardless either the s-polarized component or the p-polarized component. Therefore, the s-polarized blue light beam L1s is reflected by the polarization separation element 44 and incident on the first light collecting element 45. On the other hand, the p-polarized blue light beam L2p passes through the polarization separation element 44 and is incident on the first phase difference element 47.

Configuration of First Light Collecting Element

The first light collecting element 45 collects the blue light beam L1s reflected by the polarization separation element 44 to the wavelength conversion element 46. The first light collecting element 45 collimates fluorescence YL incident from the wavelength conversion element 46. Although the first light collecting element 45 includes two lenses 451 and 452 in an example in FIG. 3, the number of lenses constituting the first light collecting element 45 is not limited.

Configuration of Wavelength Conversion Element

The wavelength conversion element 46 is excited by an incident light beam, generates the fluorescence YL having a longer wavelength than the incident light beam, and emits the fluorescence YL to the first light collecting element 45. In other words, the wavelength conversion element 46 converts a wavelength of the incident light beam and emits the converted light beam. The fluorescence YL generated by the wavelength conversion element 46 is, for example, a light beam having a peak wavelength of 500 nm to 700 nm. The wavelength conversion element 46 includes a wavelength conversion unit 461 and a heat dissipation unit 462.

The wavelength conversion unit 461 includes a wavelength conversion layer and a reflection layer (not shown). The wavelength conversion layer includes a phosphor that diffuses and emits the fluorescence YL that is a non-polarized light beam obtained by converting a wavelength of the incident blue light beam L1s. The reflection layer reflects the fluorescence YL incident from the wavelength conversion layer toward a first light collecting element 45 side.

The heat dissipation unit 462 is provided on an opposite side of the wavelength conversion unit 461 from a light incident side, and discharges heat generated by the wavelength conversion unit 461.

The fluorescence YL emitted from the wavelength conversion element 46 passes through the first light collecting element 45 along the illumination optical axis Ax2, and then is incident on the polarization separation element 44 having the color separation characteristic. Then, the fluorescence YL passes through the polarization separation element 44 along the illumination optical axis Ax2 and is incident on the second phase difference element RP.

The wavelength conversion element 46 may be rotated around a rotation axis parallel to the illumination optical axis Ax2 by a rotation device such as a motor.

Configuration of First Phase Difference Element and Second Light Collecting Element The first phase difference element 47 is provided between the polarization separation element 44 and the second light collecting element 48. The first phase difference element 47 converts the blue light beam L2p that passed through the polarization separation element 44 into a circularly polarized blue light beam L2c. The blue light beam L2c is incident on the second light collecting element 48.

The second light collecting element 48 collects the blue light beam L2c incident from the first phase difference element 47 to the diffusion reflection unit 49. The second light collecting element 48 collimates the blue light beam L2c incident from the diffusion reflection unit 49. The number of lenses constituting the second light collecting element 48 can be changed as appropriate.

Configuration of Diffusion Reflection Unit

The diffusion reflection unit 49 reflects and diffuses the incident blue light beam L2c at the same diffusion angle as the fluorescence YL emitted from the wavelength conversion element 46. An example of a configuration of the diffusion reflection unit 49 includes a reflection plate that Lambert reflects the incident blue light beam L2c and a rotation device that rotates the reflection plate around a rotation axis parallel to the illumination optical axis Ax1.

The blue light beam L2c reflected by the diffusion reflection unit 49 passes through the second light collecting element 48, and then is incident on the first phase difference element 47. The blue light beam L2c is converted into a circularly polarized light beam in a direction opposite to a rotation direction when the blue light beam L2c is reflected by the diffusion reflection unit 49. Therefore, the blue light beam L2c incident on the first phase difference element 47 via the second light collecting element 48 is converted into the s-polarized blue light beam L2s instead of the p-polarized blue light beam L2p incident on the first phase difference element 47 from the polarization separation element 44. Then, the blue light beam L2s is reflected by the polarization separation element 44 and is incident on the second phase difference element RP. That is, light that is incident on the second phase difference element RP from the polarization separation element 44 is white light in which the blue light beam L2s and the fluorescence YL are mixed.

Configuration of Second Phase Difference Element

The second phase difference element RP converts the white light incident from the polarization separation element 44 into light in which an s-polarized light beam and ap-polarized light beam are mixed. White illumination light WL converted in this manner is incident on the homogenizing unit 31.

Configuration of Cooling Device

Figure 4:
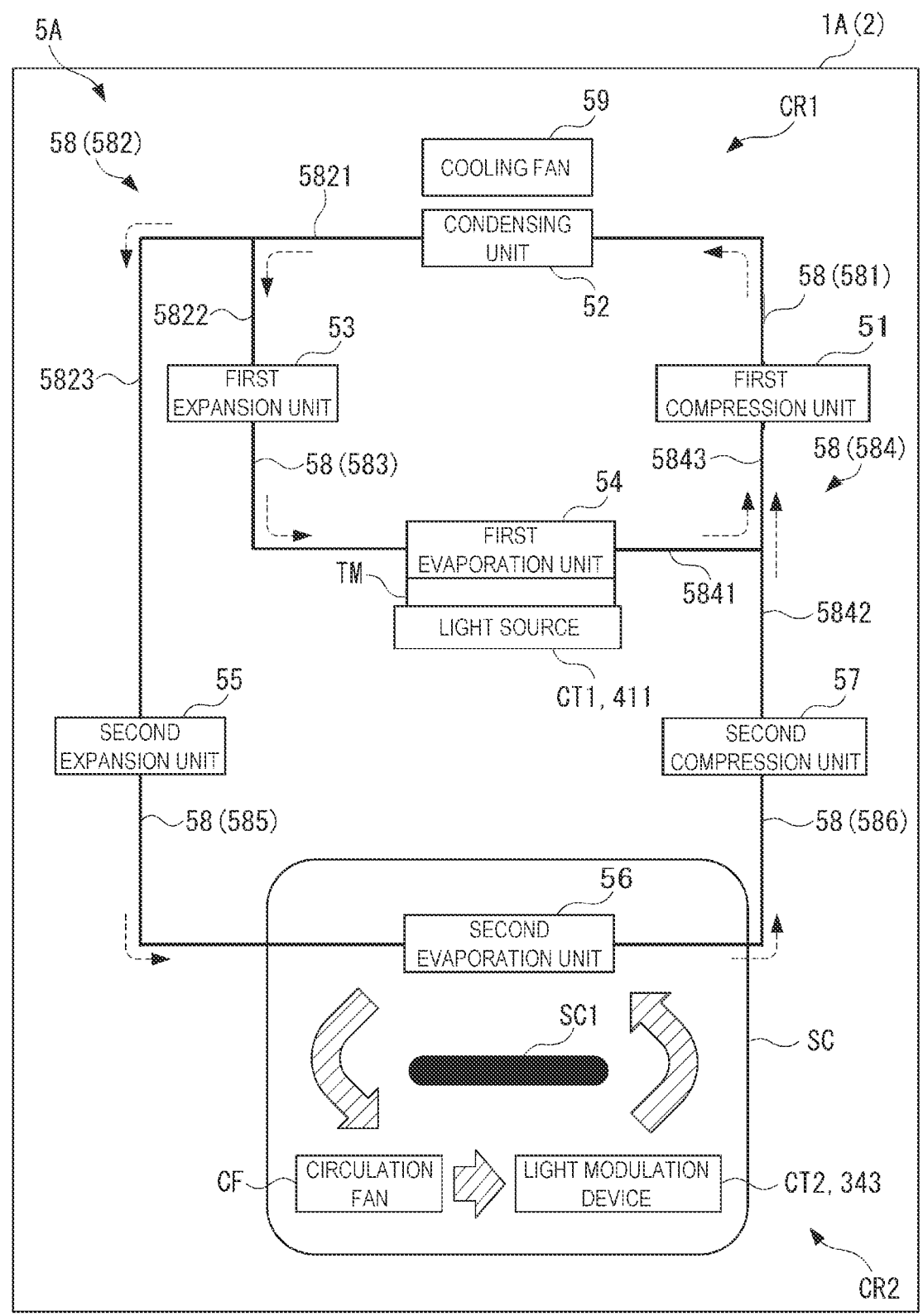
FIG. 4 is a schematic diagram showing a configuration of a cooling device according to the first embodiment.

FIG. 4 is a schematic diagram showing the cooling device 5A. In FIG. 4, a circulation direction of a working fluid is indicated by dotted line arrows, and a circulation direction of a cooling gas in the sealed housing SC is indicated by shaded arrows.

The cooling device 5A cools a cooling target of the projector 1A. Specifically, the cooling device 5A circulates the working fluid whose phase is changed between a liquid phase and a gas phase to cool the cooling target. The cooling target includes a first cooling target CT1 and a second cooling target CT2. As shown in FIG. 4, the cooling device 5A, the first cooling target CT1, and the second cooling target CT2 are accommodated in the exterior housing 2. A management temperature range of the first cooling target CT1 is defined as a first temperature range, and the first cooling target CT1 includes the light source 411 in the present embodiment. A management temperature range of the second cooling target CT2 is defined as a second temperature range lower than the first temperature range, and the second cooling target CT2 includes the light modulator 343 in the present embodiment. That is, the management temperature range of the second cooling target CT2 is lower than the management temperature range of the first cooling target CT.

A lower limit value of the first temperature range may be lower than an upper limit value of the second temperature range. In this case, an intermediate value of the first temperature range may be higher than an intermediate value of the second temperature range.

The cooling device 5A includes a first compressor 51, a condenser 52, a first expander 53, a first evaporator 54, a second expander 55, the second evaporator 56, a second compressor 57, a pipe 58 that couples these units such that the working fluid can circulate therein, and a cooling fan 59.

Configuration of Pipe

The pipe 58 includes a first pipe 581, a second pipe 582, a third pipe 583, a fourth pipe 584, a fifth pipe 585, and a sixth pipe 586.

The first pipe 581 couples the first compressor 51 and the condenser 52. The second pipe 582 couples the condenser 52, the first expander 53, and the second expander 55. The third pipe 583 couples the first expander 53 and the first evaporator 54. The fourth pipe 584 couples the first evaporator 54, the second compressor 57, and the first compressor 51. The fifth pipe 585 couples the second expander 55 and the second evaporator 56. The sixth pipe 586 couples the second evaporator 56 and the second compressor 57.

The second pipe 582 includes a flow dividing pipe 5821 and branch pipes 5822 and 5823.

The flow dividing pipe 5821 couples the condenser 52 and the branch pipes 5822 and 5823. The flow dividing pipe 5821 is configured such that the working fluid flowing from the condenser 52 flows through an inside of the flow dividing pipe 5821, and branches toward the first expander 53 and the second expander 55.

The branch pipe 5822 couples the flow dividing pipe 5821 and the first expander 53. The branch pipe 5822 is configured such that a part of the working fluid branching at the flow dividing pipe 5821 flows to the first expander 53. The branch pipe 5822 corresponds to a first branch pipe.

The branch pipe 5823 couples the flow dividing pipe 5821 and the second expander 55. The branch pipe 5823 is configured such that the other working fluid branching at the flow dividing pipe 5821 flows to the second expander 55. The branch pipe 5823 corresponds to a second branch pipe.

The second pipe 582 is configured such that a flow rate of the working fluid flowing from the flow dividing pipe 5821 to the first expander 53 via the branch pipe 5822 is larger than a flow rate of the working fluid flowing from the flow dividing pipe 5821 to the second expander 55 via the branch pipe 5823. That is, a flow rate of the working fluid flowing from the condenser 52 to the first expander 53 is larger than a flow rate of the working fluid flowing from the condenser 52 to the second expander 55, and a flow rate of the working fluid flowing to the first evaporator 54 is larger than a flow rate of the working fluid flowing to the second evaporator 56.

However, the present disclosure is not limited thereto. The flow rate of the working fluid flowing to the first expander 53 via the branch pipe 5822 may be the same as the flow rate of the working fluid flowing to the second expander 55 via the branch pipe 5823. Alternatively, the flow rate of the working fluid flowing to the first expander 53 via the branch pipe 5822 may be smaller than the flow rate of the working fluid flowing to the second expander 55 via the branch pipe 5823.

The fourth pipe 584 includes branch pipes 5841 and 5842 and a joining pipe 5843.

The branch pipe 5841 couples the first evaporator 54 and the joining pipe 5843. The branch pipe 5841 is configured such that the working fluid flowing from the first evaporator 54 flows to the joining pipe 5843. The branch pipe 5841 corresponds to a first coupling pipe.

The branch pipe 5842 couples the second compressor 57 and the joining pipe 5843. The branch pipe 5842 is configured such that the working fluid flowing from the second compressor 57 flows to the joining pipe 5843. The branch pipe 5842 corresponds to a second coupling pipe.

The joining pipe 5843 couples the branch pipes 5841 and 5842 and the first compressor 51. The joining pipe 5843 is configured such that the working fluid flowing from the first evaporator 54 via the branch pipe 5841 and the working fluid flowing from the second compressor 57 via the branch pipe 5842 join each other and flow to the first compressor 51.

Configuration of First Compressor

The first compressor 51 compresses the working fluid in a gas phase. That is, the first compressor 51 compresses the working fluid in a gas phase flowing from the fourth pipe 584 to increase a temperature and a pressure of the working fluid in a gas phase to a high temperature and a high pressure. The working fluid in a gas phase whose temperature and pressure are increased by the first compressor 51 to a high temperature and a high pressure flows to the condenser 52 via the first pipe 581.

Configuration of Condenser

The condenser 52 is coupled with the first compressor 51 via the first pipe 581. The condenser 52 condenses the working fluid in a gas phase compressed by the first compressor 51, that is, the high-temperature and high-pressure working fluid in a gas phase into a working fluid in a liquid phase. More specifically, the condenser 52 condenses the working fluid in a gas phase into the high-pressure working fluid in a liquid phase by exchanging heat between the compressed working fluid in a gas phase and a cooling gas that is introduced from an outside of the exterior housing 2 to an inside of the exterior housing 2 and is blown to the condenser 52 by the cooling fan 59.

Configuration of First Expander

The first expander 53 is a decompressor, and is coupled with the condenser 52 via the second pipe 582. More specifically, the first expander 53 is coupled with the condenser 52 via the flow dividing pipe 5821 and the branch pipe 5822. A part of working fluid among the working fluid in a liquid phase condensed by the condenser 52 flows into the first expander 53.

The first expander 53 decompresses the part of the working fluid in a liquid phase condensed by the condenser 52, and changes a state of the working fluid to a state in which a liquid phase and a gas phase are mixed. That is, the first expander 53 reduces a temperature of the working fluid. The first expander 53 is implemented by, for example, an expansion valve, more specifically, an electronic expansion valve, capable of controlling an evaporation temperature of the working fluid in a liquid phase.

Configuration of First Evaporator

The first evaporator 54 is coupled with the first expander 53 via the third pipe 583. The working fluid in the state in which a liquid phase and a gas phase are mixed flowing from the first expander 53 flows to the first evaporator 54.

As described above, the first evaporator 54 is coupled with the support member 414 of the light source 411 via the heat transfer member TM, and heat generated by the plurality of first semiconductor lasers 412 and the plurality of second semiconductor lasers 413 is transferred to the first evaporator 54 via the support member 414 and the heat transfer member TM. That is, the first evaporator 54 is coupled with the light source 411 in a heat transferable manner, and heat of the light source 411 is transferred to the first evaporator 54.

By using the heat transferred from the light source 411, the first evaporator 54 evaporates the working fluid in a liquid phase flowing from the first expander 53 and changes the working fluid in a liquid phase into the working fluid in a gas phase. Accordingly, heat of the plurality of first semiconductor lasers 412 and the plurality of second semiconductor lasers 413 is consumed, and the plurality of first semiconductor lasers 412 and the plurality of second semiconductor lasers 413 are cooled.

The first evaporator 54 is coupled with the first compressor 51 via the branch pipe 5841 and the joining pipe 5843 of the fourth pipe 584. The first evaporator 54 discharges the working fluid changed into a gas phase to the first compressor 51 via the fourth pipe 584.

As described above, the cooling device 5A includes a first circulation path CR1 in which the working fluid flows in the first compressor 51, the first pipe 581, the condenser 52, the flow dividing pipe 5821 and the branch pipe 5822 of the second pipe 582, the first expander 53, the third pipe 583, the first evaporator 54, and the fourth pipe 584 in this order, and the working fluid flows into the first compressor 51 again. As described above, the first circulation path CR1 cools the light source 411 included in the first cooling target CT1.

Configuration of Second Expander

The second expander 55 is a decompressor, and is coupled with the condenser 52 via the second pipe 582. Specifically, the second expander 55 is coupled with the condenser 52 via the flow dividing pipe 5821 and the branch pipe 5823 of the second pipe 582. The other part of the working fluid among the working fluid in a liquid phase condensed by the condenser 52 flows into the second expander 55.

The second expander 55 decompresses the other part of the working fluid in a liquid phase condensed by the condenser 52, and changes a state of the working fluid to the state in which a liquid phase and a gas phase are mixed, thereby reducing a temperature of the working fluid. Similarly to the first expander 53, the second expander 55 is implemented by, for example, an expansion valve, specifically, an electronic expansion valve.

An opening degree of the expansion valve constituting the first expander 53 and an opening degree of the expansion valve constituting the second expander 55 can be separately adjusted. In other words, a temperature of the working fluid flowing out of the first expander 53 and a temperature of the working fluid flowing out of the second expander 55 can be separately adjusted.

Configuration of Second Evaporator

The second evaporator 56 is coupled with the second expander 55 via the fifth pipe 585. The working fluid decompressed by the second expander 55 flows into the second evaporator 56 via the fifth pipe 585.

As described above, the second evaporator 56 is provided in the sealed housing SC in which the incident side polarizers 342, the light modulators 343, the viewing angle compensation plates 344, the emission side polarizers 345, and the color combining unit 346 are provided. The second cooling target CT2 includes the incident side polarizers 342, the light modulators 343, the viewing angle compensation plates 344, the emission side polarizers 345, and the color combining unit 346. For example, the second cooling target CT2 may be at least one of the light modulator 343 and the emission side polarizer 345. That is, although the second cooling target CT2 includes at least the light modulator 343 in the present embodiment, the second cooling target CT2 may include at least the emission side polarizer 345. As described above, the projector 1A includes the sealed housing SC in which the second cooling target CT2 and the second evaporator 56 are provided.

The second evaporator 56 evaporates the working fluid in a liquid phase flowing from the second expander 55 by using heat of the cooling gas that is inside the sealed housing SC and is received from at least one heat source of the second cooling target CT2, that is, by using heat transferred from the second cooling target CT2, so as to change the working fluid in a liquid phase into the working fluid in a gas phase. Accordingly, the second evaporator 56 cools the cooling gas in the sealed housing SC. That is, the working fluid flowing to the second compressor 57 from the second evaporator 56 via the sixth pipe 586 is the working fluid in a gas phase.

The projector 1A includes a circulation fan CF that circulates, in the sealed housing SC, the cooling gas inside the sealed housing SC. Further, a partition wall SC1 is disposed in the sealed housing SC. The cooling gas cooled by the second evaporator 56 is circulated, by the circulation fan CF, in the sealed housing SC along an air circulation flow path formed by the partition wall SC1. Accordingly, configurations of the image forming unit 34 inside the sealed housing SC such as the light modulator 343 and the emission side polarizer 345 are cooled by the cooling gas cooled by the second evaporator 56.

Configuration of Second Compressor

The second compressor 57 is coupled with the second evaporator 56 via the sixth pipe 586. The second compressor 57 is coupled with the first compressor 51 via the fourth pipe 584.

The second compressor 57 compresses the working fluid in a gas phase flowing from the second evaporator 56 via the sixth pipe 586. That is, the second compressor 57 increases a temperature and a pressure of the working fluid in a gas phase to a high temperature and a high pressure. The working fluid in a gas phase compressed by the second compressor 57 flows through the branch pipe 5842 of the fourth pipe 584, joins the working fluid in a gas phase flowing through the branch pipe 5841 at the joining pipe 5843, and flows to the first compressor 51. That is, the second compressor 57 discharges the compressed working fluid in a gas phase to the first compressor 51 via the fourth pipe 584.

Here, the second compressor 57 compresses the working fluid in a gas phase flowing from the second evaporator 56 such that a pressure of the working fluid in a gas phase flowing into the branch pipe 5842 of the fourth pipe 584 from the second compressor 57 is substantially the same as a pressure of the working fluid in a gas phase flowing into the branch pipe 5841 of the fourth pipe 584 from the first evaporator 54. That is, the pressure of the working fluid in a gas phase compressed by the second compressor 57 is substantially the same as the pressure of the working fluid in a gas phase discharged from the first evaporator 54. Thus, the working fluid in a gas phase flowing through the branch pipe 5842 from the second compressor 57 and the working fluid in a gas phase flowing through the branch pipe 5841 from the first evaporator 54 can join each other at the joining pipe 5843 and can easily flow to the first compressor 51.

A drive frequency of the second compressor 57 and a drive frequency of the first compressor 51 are substantially the same. Accordingly, it is possible to prevent an increase in noises generated in each of the compressors 51 and 57 at timing when phases of the drive frequencies coincide with each other. The drive frequency of the first compressor 51 and the drive frequency of the second compressor 57 being substantially the same includes the drive frequencies being the same.

As described above, the cooling device 5A includes a second circulation path CR2 in which the working fluid flows in the first compressor 51, the first pipe 581, the condenser 52, the flow dividing pipe 5821 and the branch pipe 5823 of the second pipe 582, the second expander 55, the fifth pipe 585, the second evaporator 56, the sixth pipe 586, the second compressor 57, and the fourth pipe 584 in this order, and the working fluid flows into the first compressor 51 again. The second circulation path CR2 and the first circulation path CR1 share a path from the joining pipe 5843 of the fourth pipe 584 to the flow dividing pipe 5821 of the second pipe 582. As described above, the second circulation path CR2 cools the light modulator 343 and the like included in the second cooling target CT2.

In the present embodiment, a heat generation amount of the first cooling target CT1 including the light source 411 is larger than a heat generation amount of the second cooling target CT2 including the light modulator 343. Therefore, the flow dividing pipe 5821 is set to make a flow rate of the working fluid in a liquid phase supplied to the first evaporator 54 via the branch pipe 5822 and the first expander 53 larger than a flow rate of the working fluid in a liquid phase supplied to the second evaporator 56 via the branch pipe 5823, the second expander 55, and the fifth pipe 585. Accordingly, the first cooling target CT1 whose heat generation amount is larger than the heat generation amount of the second cooling target CT2 can be more suitably cooled. Therefore, a temperature of the first cooling target CT1 can be maintained at a temperature within the first temperature range and a temperature of the second cooling target CT2 can be maintained at a temperature within the second temperature range.

As described above, in the cooling device 5A according to the present embodiment, the first evaporator 54 takes heat generated by the plurality of first semiconductor lasers 412 and the plurality of second semiconductor lasers 413, so that the light source 411 can be cooled. In addition, in the cooling device 5A, the second evaporator 56 takes heat of the cooling gas in the sealed housing SC, so that the cooling gas can be cooled and hence the image forming unit 34 including the light modulator 343 can be cooled. Therefore, the two cooling targets can be cooled.

The working fluid changed into the working fluid in a liquid phase by the condenser 52 flows to the first expander 53 and the second expander 55 via the second pipe 582.

Here, in a case in which the working fluid flowing to the first expander 53 is the working fluid in the state in which a liquid phase and a gas phase are mixed, abnormal noises may be generated when the first expander 53 expands the working fluid. The same applies to the second expander 55.

In contrast, the working fluid changed into the working fluid in a liquid phase by the condenser 52 flows to each of the first expander 53 and the second expander 55 via the second pipe 582. Accordingly, abnormal noises generated during expansion of the working fluid by the first expander 53 and the second expander 55 can be prevented. Therefore, noise reduction of the cooling device 5A and the projector 1A can be achieved.

Effects of First Embodiment

The projector 1A according to the present embodiment described above can achieve the following effects.

For example, the projector 1A modulates and projects light emitted from the light source 411. The projector 1A includes the first cooling target CT1, the second cooling target CT2, the cooling device 5A that cools the first cooling target CT1 and the second cooling target CT2, and the exterior housing 2 that accommodates the first cooling target CT1, the second cooling target CT2, and the cooling device 5A. The cooling device 5A includes the first pipe 581, the second pipe 582, the third pipe 583, the fourth pipe 584, the fifth pipe 585, the sixth pipe 586, the first compressor 51, the condenser 52, the first expander 53, the first evaporator 54, the second expander 55, the second evaporator 56, and the second compressor 57.

The first compressor 51 compresses the working fluid in a gas phase.

The condenser 52 is coupled with the first compressor 51 via the first pipe 581. The condenser 52 condenses the working fluid in a gas phase compressed by the first compressor 51 to the working fluid in a liquid phase.

The first expander 53 is coupled with the condenser 52 via the second pipe 582. The first expander 53 decompresses a part of the working fluid in a liquid phase condensed by the condenser 52, and changes a state of the working fluid to a state in which a liquid phase and a gas phase are mixed.

The first evaporator 54 is coupled with the first expander 53 via the third pipe 583. The first evaporator 54 changes the working fluid flowing from the first expander 53 into the working fluid in a gas phase by using heat transferred from the first cooling target CT1. The first evaporator 54 discharges the working fluid that was changed to the working fluid in a gas phase to the first compressor 51 coupled with the first evaporator 54 via the fourth pipe 584.

The second expander 55 is coupled with the condenser 52 via the second pipe 582. The second expander 55 decompresses the other part of the working fluid condensed by the condenser 52, and changes a state of the working fluid to the state in which a liquid phase and a gas phase are mixed.

The second evaporator 56 is coupled with the second expander 55 via the fifth pipe 585. The second evaporator 56 changes the working fluid in a liquid phase flowing from the second expander 55 into the working fluid in a gas phase by using heat transferred from the second cooling target CT2.

The second compressor 57 is coupled with the first compressor 51 via the fourth pipe 584, and is coupled with the second evaporator 56 via the sixth pipe 586. The second compressor 57 compresses the working fluid in a gas phase flowing from the second evaporator 56, and discharges the compressed working fluid to the first compressor 51 via the fourth pipe 584.

According to such a configuration, the first cooling target CT1 can be cooled by the first circulation path CR1 in which the working fluid flows from the first compressor 51, the first pipe 581, the condenser 52, the second pipe 582, the first expander 53, the third pipe 583, the first evaporator 54 to the fourth pipe 584 and the working fluid flows into the first compressor 51 again. The second cooling target CT2 can be cooled by the second circulation path CR2 in which the working fluid flows through the first compressor 51, the first pipe 581, the condenser 52, the second pipe 582, the second expander 55, the fifth pipe 585, the second evaporator 56, the sixth pipe 586, the second compressor 57, and the fourth pipe 584 and the working fluid circulates to the first compressor 51 again.

Accordingly, the first cooling target CT1 and the second cooling target CT2 can be cooled by one cooling device 5A. Therefore, it is not necessary to provide a circulation path in which the working fluid circulates for each cooling target, and the first circulation path CR1 that cools the first cooling target CT1 and the second circulation path CR2 that cools the second cooling target CT2 can share the first compressor 51, the first pipe 581, and the condenser 52. Therefore, the projector 1A including the cooling device 5A can be miniaturized.

Further, the cooling device 5A is provided in the exterior housing 2 together with the first cooling target CT1 and the second cooling target CT2. According to this configuration, the projector 1A can be easily installed and an appearance of the projector 1A can be improved compared with a case in which a part of the cooling device 5A is provided outside the exterior housing 2. Further, the projector 1A can be implemented in a small size, and the projector 1A can be implemented to be portable.

In addition, the working fluid that was changed into the working fluid in a liquid phase by the condenser 52 flows to each of the first expander 53 and the second expander 55. Accordingly, abnormal noises generated during expansion of the working fluid by the first expander 53 and the second expander 55 can be prevented. Therefore, noise reduction of the cooling device 5A and the projector 1A can be achieved.

Each of the first expander 53 and the second expander 55 is implemented by an expansion valve. An opening degree of the expansion valve constituting the first expander 53 and an opening degree of the expansion valve constituting the second expander 55 can be separately adjusted.

According to such a configuration, a temperature of the working fluid flowing from the first expander 53 to the first evaporator 54 and a temperature of the working fluid flowing from the second expander 55 to the second evaporator 56 can be separately adjusted. Therefore, the temperature of the working fluid flowing to the first evaporator 54 can be set to a temperature suitable for cooling the first cooling target CT1, and the temperature of the working fluid flowing to the second evaporator 56 can be set to a temperature suitable for cooling the second cooling target CT2.

Here, when a drive frequency of the first compressor 51 and a drive frequency of the second compressor 57 are different, noises of the first compressor 51 and noises of the second compressor 57 overlap with each other at timing when phases of the drive frequencies coincide with each other, noises of the cooling device 5A increase. In this case, the noises increase at a constant cycle, and a user is likely to feel discomfort. On the other hand, when a difference between the drive frequency of the first compressor 51 and the drive frequency of the second compressor 57 is very large, a cycle in which phases coincide with each other is very long and a discomfort feeling of the user is not much. However, when the difference between the drive frequency of the first compressor 51 and the drive frequency of the second compressor 57 is very large, that is, when the drive frequency of the first compressor 51 is greatly different from the drive frequency of the second compressor 57, the second compressor 57 cannot compress the working fluid flowing from the second evaporator 56 in accordance with a pressure of the working fluid flowing from the first evaporator 54 to the first compressor 51.

In contrast, the drive frequency of the first compressor 51 and the drive frequency of the second compressor 57 are substantially the same. According to this configuration, noises can be prevented from becoming large at a constant cycle while compression performance of the compressors can be ensured. Therefore, the user is less likely to feel discomfort.

The fourth pipe 584 includes the branch pipe 5841 serving as the first coupling pipe, the branch pipe 5842 serving as the second coupling pipe, and the joining pipe 5843. The branch pipe 5841 is coupled with the first evaporator 54. The branch pipe 5842 is coupled with the second compressor 57. The joining pipe 5843 is configured such that the working fluid flowing from the first evaporator 54 via the branch pipe 5841 and the working fluid flowing from the second compressor 57 via the branch pipe 5842 join each other, and flow to the first compressor 51.

According to such a configuration, the working fluid can efficiently flow from the first evaporator 54 and the second compressor 57 to the first compressor 51.

A heat generation amount of the first cooling target CT1 is larger than a heat generation amount of the second cooling target CT2. A flow rate of the working fluid supplied to the first evaporator 54 is larger than a flow rate of the working fluid supplied to the second evaporator 56.

According to such a configuration, more working fluid than the working fluid flowing to the second evaporator 56 can flow to the first evaporator 54 that cools the first cooling target CT1 whose heat generation amount is larger than a heat generation amount of the second cooling target CT2. Therefore, the working fluid at a flow rate suitable for cooling the first cooling target CT1 can flow to the first evaporator 54, and a temperature of the first cooling target CT1 can be easily maintained at a management temperature.

A pressure of the working fluid in a gas phase compressed by the second compressor 57 is substantially the same as a pressure of the working fluid in a gas phase discharged from the first evaporator 54.

According to such a configuration, the working fluid in a gas phase discharged from the first evaporator 54 and the working fluid in a gas phase compressed by the second compressor 57 can join each other easily at the fourth pipe 584. Therefore, the working fluid in a gas phase discharged from the first evaporator 54 and the working fluid in a gas phase discharged from the second compressor 57 can easily and efficiently flow to the first compressor 51.

The projector 1A includes the light modulator 343 that modulates light emitted from the light source 411. The first cooling target CT1 includes the light source 411. The second cooling target CT2 includes the light modulator 343.

According to such a configuration, the light source 411 and the light modulator 343 can be cooled by one cooling device 5A.

The projector 1A includes the sealed housing SC as a housing in which the second cooling target CT2 and the second evaporator 56 are provided and the circulation fan CF that circulates, in the sealed housing SC, the cooling gas inside the sealed housing SC. The second evaporator 56 changes the working fluid in a liquid phase into the working fluid in a gas phase by using heat of the cooling gas transferred from the second cooling target CT2.

According to such a configuration, since the second cooling target CT2 is provided in the sealed housing SC, dust or the like can be prevented from adhering to the second cooling target CT2. The second cooling target CT2 is cooled by the cooling gas in the sealed housing SC, and the second evaporator 56 uses heat transferred to the cooling gas from the second cooling target CT2 to evaporate the working fluid in a liquid phase, so that the cooling gas inside the sealed housing SC is cooled. According to this configuration, a configuration of the cooling device 5A can be simplified compared with a configuration in which the second evaporator 56 is provided for each of the plurality of light modulators 343 included in the second cooling target CT2.

Second Embodiment

Next, a second embodiment of the present disclosure will be described.

A projector according to the present embodiment has a configuration similar to the configuration of the projector 1A according to the first embodiment. Here, in the cooling device 5A according to the first embodiment, a part of the working fluid flowing out of the condenser 52 flows to the second expander 55 via the second pipe 582. In contrast, in a cooling device provided in the projector according to the present embodiment, a part of the working fluid flowing out of the condenser flows to the condenser again, and then flows to the second expander 55. The projector according to the present embodiment is different from the projector 1A according to the first embodiment in terms of this point. In the following description, the same or substantially the same components as those already described are denoted by the same reference numerals, and description thereof will be omitted.

Schematic Configuration of Projector

Figure 5:
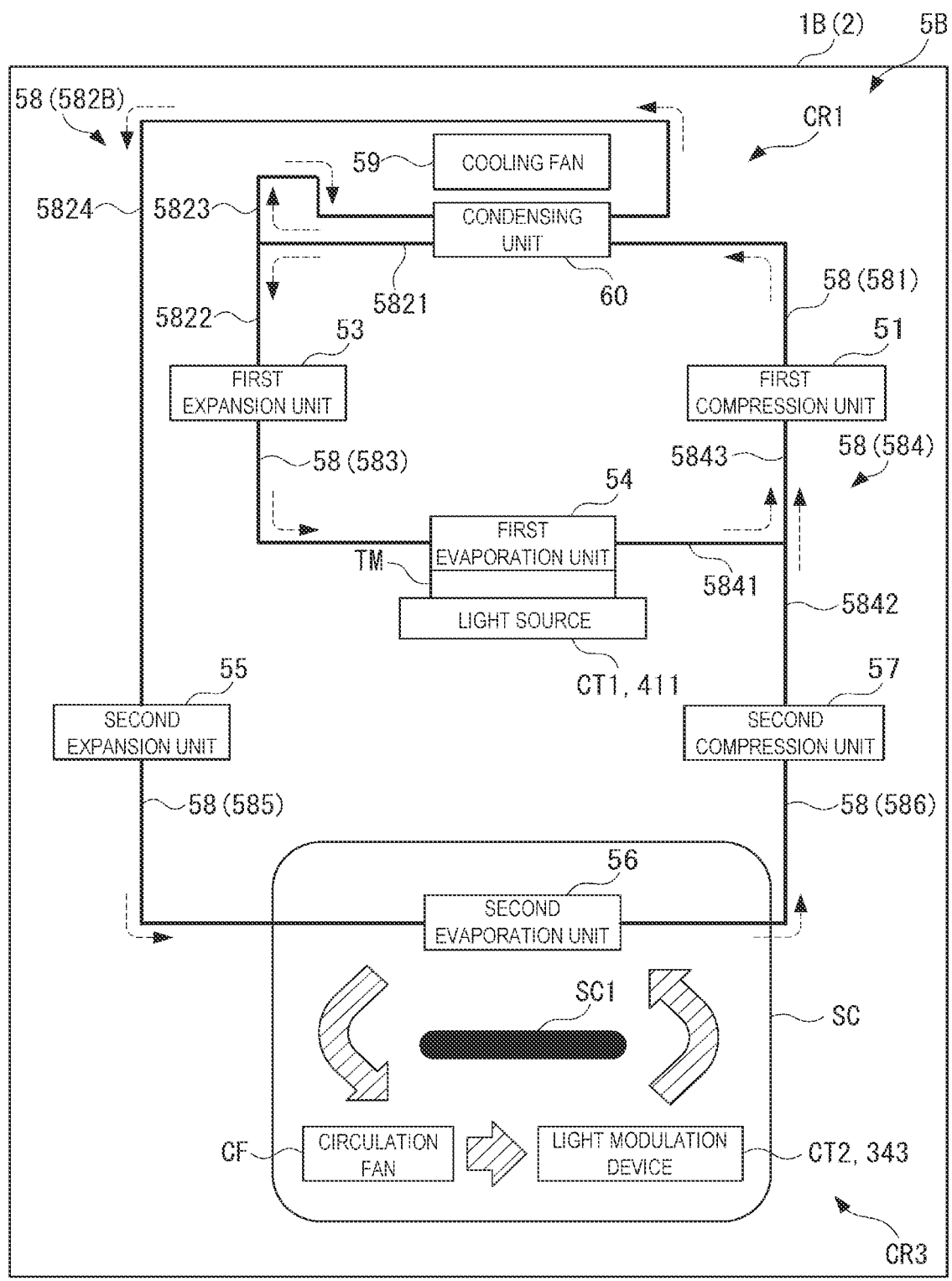
FIG. 5 is a schematic diagram showing a configuration of a cooling device provided in a projector according to a second embodiment.

FIG. 5 is a schematic diagram showing a configuration of a cooling device 5B provided in a projector 1B according to the present embodiment.

As shown in FIG. 5, the projector 1B according to the present embodiment includes the cooling device 5B shown in FIG. 5 instead of the cooling device 5A. Other configurations and functions are the same as those of the projector 1A according to the first embodiment.

Configuration of Cooling Device

Similarly to the cooling device 5A, the cooling device 5B cools the first cooling target CT1 and the second cooling target CT2. Specifically, the cooling device 5B cools the first cooling target CT1 including the light source 411, and further cools the second cooling target CT2 including the light modulator 343 via cooling air in the sealed housing SC.

The cooling device 5B has the same configuration and function as those of the cooling device 5A except that the cooling device 5B includes a condenser 60 and a second pipe 582B instead of the condenser 52 and the second pipe 582.

Specifically, the cooling device 5B includes the first compressor 51, the condenser 60, the first expander 53, the first evaporator 54, the second expander 55, the second evaporator 56, the second compressor 57, the pipe 58 that couples these units, and the cooling fan 59. In the present embodiment, the pipe 58 includes the second pipe 582B instead of the second pipe 582.

The second pipe 582B includes the flow dividing pipe 5821, the branch pipes 5822 and 5823, and a circulation pipe 5824.

Similarly to the cooling device 5A, the flow dividing pipe 5821 couples the condenser 60 and the branch pipes 5822 and 5823. The flow dividing pipe 5821 is configured such that the working fluid flowing from the condenser 60 flows through an inside of the flow dividing pipe 5821, and branches toward the first expander 53 and toward the condenser 60.

The branch pipe 5822 serving as a first branch pipe couples the flow dividing pipe 5821 and the first expander 53. The branch pipe 5822 is configured such that a part of the working fluid branching at the flow dividing pipe 5821 flows to the first expander 53.

The branch pipe 5823 serving as a second branch pipe couples the flow dividing pipe 5821 and the condenser 60. The branch pipe 5823 is configured such that the other part of the working fluid branching at the flow dividing pipe 5821 flows to a second flow path 605 to be described later of the condenser 60. The working fluid flowing into the branch pipe 5823 is the working fluid in a liquid phase once condensed by the condenser 60. That is, in the cooling device 5B, the working fluid whose phase is changed from a gas phase to a liquid phase by condensing the working fluid by the condenser 60 flows to the condenser 60 again. Accordingly, a temperature of the working fluid whose phase was changed to a liquid phase by the condenser 60 is reduced by flowing through the condenser 60 again.

The circulation pipe 5824 couples the condenser 60 and the second expander 55. The circulation pipe 5824 is configured such that the working fluid in a liquid phase flowing through the second flow path 605 of the condenser 60 flows to the second expander 55. The working fluid flowing to the condenser 60 again via the branch pipe 5823 flows into the circulation pipe 5824. That is, the working fluid flowing through the condenser 60 twice flows into the circulation pipe 5824. The working fluid in a liquid phase flowing through the circulation pipe 5824 flows to the second expander 55.

Configuration of Condenser

Similarly to the condenser 52 according to the first embodiment, the condenser 60 condenses the working fluid in a gas phase compressed by the first compressor 51 and changes the working fluid in a gas phase into the working fluid in a liquid phase. Specifically, the condenser 60 condenses the working fluid in a gas phase to a high-pressure working fluid in a liquid phase by the cooling fan 59 exchanging heat between a cooling gas flowing in the condenser 60 and the working fluid in a gas phase that was condensed. Further, the condenser 60 condenses the working fluid in a liquid phase to the high-pressure working fluid in a liquid phase by exchanging heat between the working fluid in a liquid phase that flows through the condenser 60 once and the cooling gas that circulates in the condenser 60. That is, the condenser 60 can be referred to as a heat exchanger.

Figure 6:
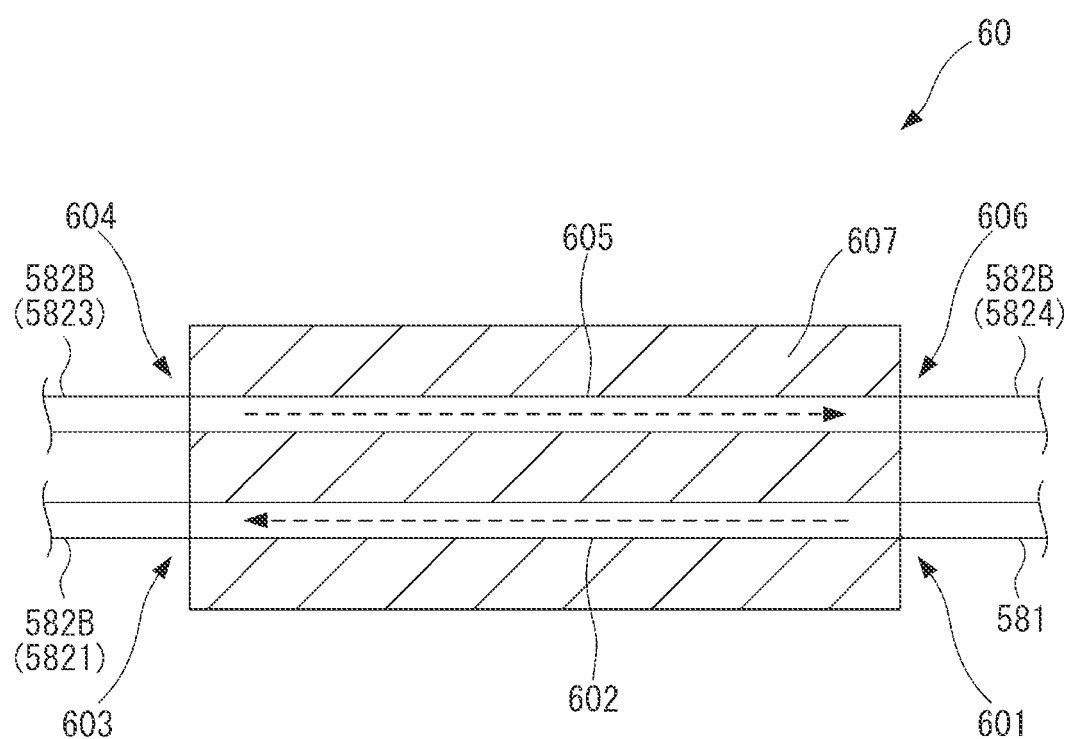
FIG. 6 is a cross-sectional view schematically showing a configuration of a condenser according to the second embodiment.

FIG. 6 is a cross-sectional view schematically showing a configuration of the condenser 60.

As shown in FIG. 6, the condenser 60 includes a first inflow portion 601, a first flow path 602, a first outflow portion 603, a second inflow portion 604, the second flow path 605, a second outflow portion 606, and a heat exchange portion 607.

The first inflow portion 601 is coupled with the first pipe 581. The working fluid from the first compressor 51 flows into the first inflow portion 601.

The first flow path 602 couples the first inflow portion 601 and the first outflow portion 603. The working fluid in a gas phase from the first compressor 51 flows to the first flow path 602 via the first inflow portion 601.

The first outflow portion 603 is coupled with the flow dividing pipe 5821 of the second pipe 582. The working fluid flowing through the first flowpath 602 flows to the flow dividing pipe 5821 via the first outflow portion 603.

The second inflow portion 604 is coupled with the branch pipe 5823. The working fluid from the first flow path 602 flows into the second inflow portion 604.

The second flow path 605 is a flow path different from the first flow path 602, and couples the second inflow portion 604 and the second outflow portion 606. The other part of the working fluid in the working fluid that flows through the first flow path 602 of the condenser 60 and whose phase is changed from a gas phase to a liquid phase flows to the second flow path 605 via the branch pipe 5823 and the second inflow portion 604. That is, the working fluid in a liquid phase flowing into the second flow path 605 is the other part of the working fluid in the working fluid in a liquid phase discharged to the flow dividing pipe 5821 other than the part of the working fluid flowing to the first expander 53 via the branch pipe 5822.

The second outflow portion 606 is coupled with the second expander 55 via the circulation pipe 5824. The second outflow portion 606 is configured such that the working fluid in a liquid phase flowing through the second flow path 605 flows to the second expander 55 via the circulation pipe 5824.

The first flow path 602 and the second flow path 605 are provided in the heat exchange portion 607. The heat exchange portion 607 is formed of a heat transfer material such as metal and exchanges heat between the working fluids flowing through the first flow path 602 and the second flow path 605 with the cooling gas circulated by the cooling fan 59.

The heat exchange portion 607 condenses and changes the working fluid in a gas phase flowing through the first flow path 602 into the working fluid in a liquid phase. That is, the working fluid flowing through the first flow path 602 is cooled by the cooling gas and is changed from the working fluid in a gas phase into the working fluid in a liquid phase.

The heat exchange portion 607 cools the working fluid in a liquid phase flowing through the second flow path 605 by exchanging heat with the cooling gas.

In this manner, the working fluid in a gas phase flowing from the first compressor 51 flows through the first flow path 602 and is changed into the working fluid in a liquid phase. In the working fluid flowing through the first flow path 602, a part of the working fluid flows to the first expander 53 via the flow dividing pipe 5821 and the branch pipe 5822. In the working fluid flowing through the first flow path 602, the other part of the working fluid flows to the second flow path 605 of the condenser 60 via the flow dividing pipe 5821 and the branch pipe 5823. Then, the working fluid in a liquid phase that is further cooled by flowing through the second flow path 605 flows to the second expander 55 via the circulation pipe 5824.

The first flow path 602 and the second flow path 605 are not limited to a linearly extending flow path. For example, the first flow path 602 may meander from the first inflow portion 601 toward the first outflow portion 603. Similarly, the second flow path 605 may meander from the second inflow portion 604 toward the second outflow portion 606. That is, each of the first flow path 602 and the second flow path 605 may have a bent portion, a folded portion, or a return portion that changes a flowing direction of the working fluid.

In the example in FIG. 6, a flowing direction of the working fluid in the first flow path 602 and a flowing direction of the working fluid in the second flow path 605 are opposite to each other. However, the present disclosure is not limited thereto. The flowing direction of the working fluid in the first flow path and the flowing direction of the working fluid in the second flow path may be the same direction.

Further, each of the first flow path 602 and the second flow path 605 may be a flow path formed in the heat exchange portion 607, or may be implemented by a tubular member through which the working fluid can flow therein. In this case, the heat exchange portion 607 may couple the tubular members in a heat transferable manner, or the tubular members may be coupled in a heat transferable manner.

Configuration of Second Circulation Path

As shown in FIG. 5, the cooling device 5B includes the first circulation path CR1 similar to the cooling device 5A and a second circulation path CR3 that cools the second cooling target CT2. The second circulation path CR3 shares a part of the first circulation path CR1. That is, the cooling device 5B includes the second circulation path CR3 instead of the second circulation path CR2.

The second circulation path CR3 is a circulation path in which the working fluid flows in the first compressor 51, the first pipe 581, the condenser 60, the flow dividing pipe 5821, the branch pipe 5823, the condenser 60, the circulation pipe 5824, the second expander 55, the fifth pipe 585, the second evaporator 56, the sixth pipe 586, the second compressor 57, and the fourth pipe 584 in this order, and the working fluid flows into the first compressor 51 again.

In the second circulation path CR3, the working fluid flowing to the second expander 55 is the working fluid in a liquid phase cooled by passing through the condenser 60 again after the working fluid flowing from the first compressor 51 is changed into the working fluid in a liquid phase by the condenser 60. Therefore, generation of abnormal noises during expansion of the working fluid by the second expander 55 can be prevented since the working fluid flowing to the second expander 55 can be the working fluid in a liquid phase. In addition, since the working fluid can be further cooled by the second expander 55, compared with the cooling device 5A, the working fluid having a lower temperature can flow to the second evaporator 56, and cooling efficiency of the second cooling target CT2 by the second evaporator 56 can be further improved.

Effects of Second Embodiment

The projector 1B according to the present embodiment described above can achieve the same effects as those of the projector 1A according to the first embodiment, and can further achieve the following effects.

The condenser 60 includes the first flow path 602 in which the working fluid from the first compressor 51 via the first pipe 581 flows and the second flow path 605 different from the first flow path 602. The second pipe 582 includes the flow dividing pipe 5821, the branch pipe 5822 serving as the first branch pipe, the branch pipe 5823 serving as the second branch pipe, and the circulation pipe 5824. The working fluid flowing from the first flow path 602 branches at the dividing pipe 5821. A part of the working fluid branching at the flow dividing pipe 5821 flows to the first expander 53 via the branch pipe 5822. The other part of the working fluid branching at the flow dividing pipe 5821 flows to the second flow path 605 via the branch pipe 5823. The working fluid flowing through the second flow path 605 flows to the second expander 55 via the circulation pipe 5824.

According to such a configuration, the working fluid flowing to the second expander 55 can be the working fluid flowing through the first flow path 602 of the condenser 60 from the first compressor 51 and further flowing through the second flow path 605 of the condenser 60. That is, the working fluid flowing to the second expander 55 may be the working fluid flowing through the condenser 60 for a plurality of times. According to this configuration, when a cycle in which the working fluid flowing out of the first compressor 51 flows into the first compressor 51 again is defined as one cycle, a temperature of the working fluid flowing to the second expander 55 can be further reduced compared with that in a case in which the number of times of the working fluid flowing through the condenser 60 is 1 in one cycle. Therefore, the working fluid at a lower temperature can flow from the second expander 55 to the second evaporator 56 that cools the second cooling target CT2. Therefore, cooling efficiency of the second cooling target CT2 by the cooling device 5B can be improved.

Modification of Embodiment

The present disclosure is not limited to the embodiments described above, and includes modifications, improvements, and the like within a scope in which the object of the present disclosure can be achieved.

In the embodiments described above, the first expander 53 and the second expander 55 are implemented by expansion valves. However, the present disclosure is not limited thereto. At least one expander of the first expander 53 and the second expander 55 may have a configuration other than the expansion valve, such as a capillary tube.

An opening degree of the expansion valve constituting the first expander 53 and an opening degree of the expansion valve constituting the second expander 55 can be separately adjusted. However, the present disclosure is not limited thereto. Only an opening degree of an expansion valve constituting one of the first expander 53 and the second expander 55 can be adjusted, or opening degrees of the expansion valves constituting the expanders 53 and 55 cannot be adjusted.

In the embodiments described above, a drive frequency of the first compressor 51 and a drive frequency of the second compressor 57 are substantially the same. However, the present disclosure is not limited thereto. When noises of the first compressor 51 and noises of the second compressor 57 are sufficiently small, the drive frequency of the first compressor 51 and the drive frequency of the second compressor 57 may not be the same.

In the embodiments described above, a flow rate of the working fluid flowing to the first expander 53 via the branch pipe 5822 serving as the first branch pipe is larger than a flow rate of the working fluid flowing to the second expander 55 via the branch pipe 5823 serving as a second branch pipe. That is, a flow rate of the working fluid flowing to the first evaporator 54 is larger than a flow rate of the working fluid flowing to the second evaporator 56. However, the present disclosure is not limited thereto. The flow rate of the working fluid flowing to the first expander 53 and the first evaporator 54 may be the same as or smaller than the flow rate of the working fluid flowing to the second expander 55 and the second evaporator 56.

A management temperature range of the second cooling target CT2 is lower than a management temperature range of the first cooling target CT1. However, the present disclosure is not limited thereto. The management temperature range of the second cooling target may be the same as or higher than the management temperature range of the first cooling target.

In the embodiments described above, a pressure of the working fluid in a gas phase compressed by the second compressor 57 is substantially the same as a pressure of the working fluid in a gas phase discharged from the first evaporator 54. However, the present disclosure is not limited thereto. The pressures of the working fluids in a gas phase may be different. In other words, the pressure of the working fluid in a gas phase flowing into the joining pipe 5843 from the first evaporator 54 via the branch pipe 5841 and the pressure of the working fluid in a gas phase flowing into the joining pipe 5843 from the second compressor 57 via the branch pipe 5842 may be different. That is, in the pressure of the working fluid in a gas phase flowing to the joining pipe 5843 via the branch pipe 5841 and the pressure of the working fluid in a gas phase flowing to the joining pipe 5843 via the branch pipe 5842, one pressure may be higher than the other pressure.

In the embodiments described above, the first cooling target CT1 cooled by the first evaporator 54 constituting the first circulation path CR1 includes the light source 411, and the second cooling target CT2 cooled by the second evaporator 56 constituting the second circulation path CR2, CR3 includes the light modulator 343. However, the present disclosure is not limited thereto. Each cooling target may have another configuration. For example, a cooling target of the cooling device 5A, 5B may be an optical component such as the polarization conversion element 313, the polarization separation element 44, the wavelength conversion unit 461 of the wavelength conversion element 46, and a reflection plate of the diffusion reflection unit 49, or may be a circuit element provided in a control device or a power supply device.

For example, one of the first cooling target and the second cooling target may be one of a plurality of light sources, and the other cooling target may be another one of the plurality of light sources. Further, for example, one of the first cooling target and the second cooling target may be one of a plurality of light modulators 343, and the other cooling target may be another one of the plurality of light modulators 343. That is, when a plurality of cooling targets that are of the same type but have at least one of different management temperatures, heat generation amounts, and cooling difficulties are provided, at least one of the cooling targets is defined as the first cooling target and other cooling targets are defined as the second cooling target.

For example, the cooling device may include a branching portion at which the working fluid flowing out of the second expander 55 branches to a plurality of second evaporators 56.

In the embodiments described above, the second evaporator 56 is provided in the sealed housing SC together with the second cooling target CT2 including the light modulator 343, and changes the working fluid in a liquid phase into the working fluid in a gas phase by using heat of the cooling gas that is a gas inside the sealed housing SC and flows to the second cooling target CT2, so that the second cooling target CT2 is cooled. That is, the second evaporator 56 cools the cooling gas by consuming heat of the cooling gas transferred from the second cooling target CT2, and cools the second cooling target CT2 by causing the cooled cooling gas to flow to the second cooling target CT2. However, the present disclosure is not limited thereto. The second evaporator 56 may not be provided in the sealed housing SC. That is, the second evaporators 56 may not be provided in the sealed housing SC, and may cool the cooling gas flowing to the second cooling target CT2. Similarly to the first evaporator 54, the second evaporator 56 may be coupled with the second cooling target CT2 in a heat transferable manner, and may directly cool the second cooling target CT2. Further, a housing in which the second evaporator 56 is provided may not be a sealed housing into which a gas is less likely to enter from outside.

Further, the circulation fan CT may not be necessarily provided as long as the second cooling target CT2 can be cooled by the cooling gas inside the sealed housing. Instead of the circulation fan CF, a fan that circulates the cooling gas cooled by the second evaporator 56 to the second cooling target CT2 may be provided.

In addition, the first evaporator 54 and the first cooling target CT1 may be provided in another housing provided in the exterior housing 2, and the first evaporator 54 may cool the cooling gas flowing to the first cooling target CT1 in the another housing.

In addition, the cooling targets cooled by the first evaporator 54 and the second evaporator 56 may not necessarily be provided in a housing such as the sealed housing SC.

In the embodiments described above, the cooling device 5A, 5B includes the cooling fan 59 that circulates the cooling gas to the condenser 52. However, the present disclosure is not limited thereto. The cooling device 5A, 5B may not necessarily include the cooling fan 59.

In the embodiments described above, the projector 1A, 1B includes the image projection device 3 shown in FIG. 2, and the image projection device 3 includes the light source device 4 shown in FIG. 3. However, the present disclosure is not limited thereto. A configuration and a layout of optical components provided in the image projection device 3 can be changed as appropriate, and a configuration and a layout of optical components provided in the light source device 4 can be changed as appropriate. For example, although the wavelength conversion element 46 provided in the light source device 4 is a reflective wavelength conversion element that emits the fluorescence YL generated by the wavelength conversion unit 461 to an incident side of the blue light beam L1s, the light source device may use a transmissive wavelength conversion element that emits the fluorescence along an incident direction of the blue light beam L1s.

In the embodiments described above, the light source 411 of the light source device 4 includes the semiconductor lasers 412 and 413. However, the present disclosure is not limited thereto. The light source device 4 may include, as a light source, a light source lamp such as an ultra-high pressure mercury lamp or another solid light source such as an LED. The light source device 4 may include, as a light source, another solid light source or light source lamp such as an LD or an LED that emits a red light beam, a green light beam, and a blue light beam. In this case, a cooling target of the cooling device 5A, 5B may be the solid light source or the light source lamp.

In the embodiments described above, the projector 1A, 1B includes three light modulators 343 (343B, 343G, and 343R). However, the present disclosure is not limited thereto. The present disclosure can also be applied to a projector including two or less or four or more light modulators.

In the embodiments described above, the light modulator 343 is a transmissive liquid crystal panel whose light incident surface and light emitting surface are different. However, the present disclosure is not limited thereto. A reflective liquid crystal panel whose light incident surface and light exit surface are the same may be used as the light modulator. As long as the light modulator can modulate an incident light beam and form an image according to image information, the light modulator may use a device other than a liquid crystal panel, such as a device using a micromirror or a device using a digital micromirror device (DMD) or the like.

Overview of Present Disclosure

The present disclosure will be overviewed as follows.

An aspect of the present disclosure provides a projector that modulates and projects light emitted from a light source, and the projector includes: a first cooling target, a second cooling target, a cooling device that cools the first cooling target and the second cooling target, and an exterior housing that accommodates the first cooling target, the second cooling target, and the cooling device. The cooling device includes: a first pipe, a second pipe, a third pipe, a fourth pipe, a fifth pipe, a sixth pipe, a first compressor that compresses a working fluid in a gas phase, a condenser that is coupled with the first compressor via the first pipe, and that condenses the working fluid in a gas phase compressed by the first compressor into a working fluid in a liquid phase, a first expander that is coupled with the condenser via the second pipe, and that decompresses a part of the working fluid condensed by the condenser to change the working fluid into a working fluid in a mixed phase of a liquid phase and a gas phase, a first evaporator that is coupled with the first expander via the third pipe, that changes the working fluid in a liquid phase flowing from the first expander into the working fluid in a gas phase by using heat transferred from the first cooling target, and that discharges the working fluid changed into a gas phase to the first compressor coupled with the first evaporator via the fourth pipe, a second expander that is coupled with the condenser via the second pipe, and that decompresses the other part of the working fluid condensed by the condenser to change the working fluid into the working fluid in a mixed phase of a liquid phase and a gas phase, a second evaporator that is coupled with the second expander via the fifth pipe, and that changes the working fluid in a liquid phase flowing from the second expander into the working fluid in a gas phase by using heat transferred from the second cooling target, and a second compressor that is coupled with the first compressor via the fourth pipe, that is coupled with the second evaporator via the sixth pipe, that compresses the working fluid in a gas phase flowing from the second evaporator, and that discharges the working fluid to the first compressor via the fourth pipe.

According to such a configuration, the first cooling target can be cooled by a first circulation path in which the working fluid flows through the first compressor, the first pipe, the condenser, the second pipe, the first expander, the third pipe, the first evaporator, and the fourth pipe and the working fluid flows to the first compressor again. The second cooling target can be cooled by the second circulation path in which the working fluid flows through the first compressor, the first pipe, the condenser, the second pipe, the second expander, the fifth pipe, the second evaporator, the sixth pipe, the second compressor, and the fourth pipe, and the working fluid flows to the first compressor again.

Accordingly, the first cooling target and the second cooling target can be cooled by one cooling device. Therefore, it is not necessary to provide a circulation path in which the working fluid circulates for each cooling target, and the first circulation path that cools the first cooling target and the second circulation path that cools the second cooling target can share the first compressor, the first pipe, the condenser, the second pipe, and the fourth pipe. Therefore, the projector including the cooling device can be reduced in size.

Further, the cooling device is provided in the exterior housing together with the first cooling target and the second cooling target. According to this configuration, the projector can be easily installed and an appearance of the projector can be improved compared with a case in which a part of the cooling device is provided outside the exterior housing. Further, the projector can be implemented in a small size, and the projector can be implemented to be portable.

Here, in a case in which the working fluid flowing to the first expander and the second expander is the working fluid in the state in which a liquid phase and a gas phase are mixed, abnormal noises are generated when the first expander and the second expander expand the working fluid.

In contrast, the working fluid that was changed to the working fluid in a liquid phase by the condenser flows to the first expander and the second expander. Accordingly, abnormal noises generated during expansion of the working fluid by the first expander and the second expander can be prevented. Therefore, noise reduction of the cooling device and the projector can be achieved.

In the above aspect, the condenser may include a first flow path in which the working fluid from the first compressor flows and a second flow path different from the first flow path, the second pipe may include a flow dividing pipe at which the working fluid flowing from the first flow path branches, a first branch pipe in which a part of the working fluid branching at the flow dividing pipe flows to the first expander, a second branch pipe in which the other part of the working fluid branching at the flow dividing pipe flows to the second flow path of the condenser, and a circulation pipe in which the working fluid flowing through the second flow path flows to the second expander.

According to such a configuration, the working fluid flowing to the second expander can be the working fluid flowing through the first flow path of the condenser from the first compressor and further flowing through the second flow path of the condenser. That is, the working fluid flowing to the second expander can be the working fluid flowing through the condenser for a plurality of times. According to this configuration, when a cycle in which the working fluid flowing out of the first compressor flows into the first compressor again is defined as one cycle, a temperature of the working fluid flowing to the second expander can be further reduced compared with that in a case in which the number of times of the working fluid flowing through the condenser is 1 in one cycle. Therefore, the working fluid at a lower temperature can flow from the second expander to the second evaporator that cools the second cooling target. Therefore, cooling efficiency of the second cooling target can be improved.

In the above aspect, each of the first expander and the second expander may be implemented by an expansion valve, an opening degree of the expansion valve constituting the first expander and an opening degree of the expansion valve constituting the second expander may be separately adjustable.

According to such a configuration, a temperature of the working fluid flowing out of the first expander and a temperature of the working fluid flowing out of the second expander can be separately adjusted. Therefore, the temperature of the working fluid flowing out of the first expander can be set to a temperature suitable for cooling the first cooling target, and the temperature of the working fluid flowing out of the second expander can be set to a temperature suitable for cooling the second cooling target.

In the above aspect, a drive frequency of the first compressor and a drive frequency of the second compressor may be substantially the same.

Here, when the drive frequency of the first compressor and the drive frequency of the second compressor are different, noises of the first compressor and noises of the second compressor overlap with each other at a timing when phases of the drive frequencies coincide with each other, noises of the cooling device increase. In this case, the noises increase at a constant cycle, and the user is likely to feel discomfort. When a difference between the drive frequency of the first compressor and the drive frequency of the second compressor is very large, a cycle in which phases coincide with each other is very long and a discomfort feeling of the user is not much. However, when the difference between the drive frequency of the first compressor and the drive frequency of the second compressor is very large, that is, when the drive frequency of the first compressor is greatly different from the drive frequency of the second compressor, the second compressor cannot compress the working fluid flowing from the second evaporator in accordance with a pressure of the working fluid flowing from the first evaporator to the first compressor.

In contrast, since the drive frequency of the first compressor and the drive frequency of the second compressor are substantially the same, noises can be prevented from becoming large at a constant cycle while compression performance of the compressors can be ensured. Therefore, the user is less likely to feel discomfort.

In the above aspect, the fourth pipe may include a first coupling pipe coupled with the first evaporator, a second coupling pipe coupled with the second compressor, and a joining pipe in which the working fluid flowing from the first evaporator via the first coupling pipe and the working fluid flowing from the second compressor via the second coupling pipe join each other and flow to the first compressor.

According to such a configuration, the working fluid can efficiently flow from the first evaporator and the second compressor to the first compressor.

In the above aspect, a heat generation amount of the first cooling target may be larger than a heat generation amount of the second cooling target, and a flow rate of the working fluid supplied to the first evaporator may be larger than a flow rate of the working fluid supplied to the second evaporator.

According to such a configuration, more working fluid in a liquid phase can flow to the first evaporator that cools the first cooling target having a larger heat generation amount than the heat generation amount of the second cooling target cooled by the second evaporator. Therefore, the working fluid at a flow rate suitable for cooling the first cooling target can flow to the first evaporator, and a temperature of the first cooling target can be easily maintained at a management temperature.

In the above aspect, a pressure of the working fluid in a gas phase compressed by the second compressor may be substantially the same as a pressure of the working fluid in a gas phase discharged from the first evaporator.

According to such a configuration, the working fluid in a gas phase discharged from the first evaporator and the working fluid in a gas phase compressed by the second compressor can easily join each other at the fourth pipe. Therefore, the working fluid in a gas phase discharged from the first evaporator and the working fluid in a gas phase discharged from the second compressor can easily and efficiently flow to the first compressor.

In the above aspect, the projector may include a light modulator that modulates light emitted from the light source, the first cooling target may include the light source, and the second cooling target may include the light modulator.

According to such a configuration, the light source and the light modulator can be cooled by one cooling device.

In the above aspect, the projector may include a housing in which the second cooling target and the second evaporation portion are provided, and a circulation fan that circulates, in the housing, a cooling gas inside the housing, and the second evaporator may change the working fluid in a liquid phase into the working fluid in a gas phase by using heat of the cooling gas transferred from the second cooling target.

According to such a configuration, since the second cooling target is provided in the housing, dust or the like can be prevented from adhering to the second cooling target. The second cooling target is cooled by the cooling gas in the housing, and the second evaporator uses heat transferred to the cooling gas from the second cooling target to evaporate the working fluid in a liquid phase, so that the cooling gas inside the housing is cooled. According to this configuration, a configuration of the cooling device can be simplified compared with a case in which the second evaporator is provided for each second cooling target when there are a plurality of second cooling targets.

What is claimed is:

1. A projector that modulates and projects light emitted from a light source, the projector comprising:
   a first cooling target;
   a second cooling target;
   a cooling device configured to cool the first cooling target and the second cooling target; and
   an exterior housing accommodating the first cooling target, the second cooling target, and the cooling device, wherein
   the cooling device includes:
      a first pipe, a second pipe, a third pipe, a fourth pipe, a fifth pipe, a sixth pipe,
      a first compressor configured to compress a working fluid in a gas phase,
      a condenser coupled with the first compressor via the first pipe, and configured to condense the working fluid in a gas phase compressed by the first compressor into a working fluid in a liquid phase,
      a first expander coupled with the condenser via the second pipe, and configured to decompress a part of the working fluid condensed by the condenser to change the working fluid into a working fluid in a mixed phase of a liquid phase and a gas phase, a first evaporator coupled with the first expander via the third pipe, configured to change the working fluid in a liquid phase flowing from the first expander into the working fluid in a gas phase by using heat transferred from the first cooling target, and discharge the working fluid changed into a gas phase to the first compressor coupled with the first evaporator via the fourth pipe, a second expander coupled with the condenser via the second pipe, and configured to decompress the other part of the working fluid condensed by the condenser to change the working fluid into the working fluid in a mixed phase of a liquid phase and a gas phase, a second evaporator coupled with the second expander via the fifth pipe, and configured to change, into the working fluid in a gas phase, the working fluid in a liquid phase flowing from the second expander by using heat transferred from the second cooling target, and a second compressor coupled with the first compressor via the fourth pipe and coupled with the second evaporator via the sixth pipe, the second compressor being configured to compress the working fluid in a gas phase flowing from the second evaporator, and discharge the working fluid to the first compressor via the fourth pipe.

2. The projector according to claim 1, wherein
the condenser includes:
  a first flow path in which the working fluid from the first compressor flows, and
  a second flow path different from the first flow path, and
the second pipe includes:
  a flow dividing pipe at which the working fluid flowing from the first flow path branches,
  a first branch pipe in which a part of the working fluid branching at the flow dividing pipe flows to the first expander,
  a second branch pipe in which the other part of the working fluid branching at the flow dividing pipe flows to the second flow path of the condenser, and
  a circulation pipe in which the working fluid flowing through the second flow path flows to the second expander.

3. The projector according to claim 1, wherein
the first expander is implemented by a first expansion valve and the second expander is implemented by a second expansion valve, and
an opening degree of the first expansion valve and an opening degree of the second expansion valve are separately adjustable.

4. The projector according to claim 1, wherein
a drive frequency of the first compressor and a drive frequency of the second compressor are substantially the same.

5. The projector according to claim 1, wherein
the fourth pipe includes:
  a first coupling pipe coupled with the first evaporator,
  a second coupling pipe coupled with the second compressor, and
  a joining pipe in which the working fluid flowing from the first evaporator via the first coupling pipe and the working fluid flowing from the second compressor via the second coupling pipe join each other and flow to the first compressor.

6. The projector according to claim 1, wherein
a heat generation amount of the first cooling target is larger than a heat generation amount of the second cooling target, and
a flow rate of the working fluid supplied to the first evaporator is larger than a flow rate of the working fluid supplied to the second evaporator.

7. The projector according to claim 1, wherein
a pressure of the working fluid in a gas phase compressed by the second compressor is substantially the same as a pressure of the working fluid in a gas phase discharged from the first evaporator.

8. The projector according to claim 1, further comprising:
a light modulator configured to modulate light emitted from the light source, wherein
the first cooling target includes the light source, and
the second cooling target includes the light modulator.

9. The projector according to claim 1, further comprising:
a housing accommodating the second cooling target and the second evaporator are provided, and
a circulation fan configured to circulate, in the housing, a cooling gas inside the housing, wherein
the second evaporator is configured to change the working fluid in a liquid phase into the working fluid in a gas phase by using heat of the cooling gas transferred from the second cooling target.

\* \* \* \* \*